United States Patent [19]

Meckler

[11] 4,304,955

[45] Dec. 8, 1981

[54] SOLAR ENERGY COLLECTOR

[75] Inventor: Gershon Meckler, Bethesda, Md.

[73] Assignee: Energy Integrated Systems, Inc., Washington, D.C.

[21] Appl. No.: 87,393

[22] Filed: Oct. 22, 1979

Related U.S. Application Data

[62] Division of Ser. No. 886,389, Mar. 14, 1978, abandoned.

[51] Int. Cl.³ .................................. H01L 31/00
[52] U.S. Cl. ............................... 136/259; 136/246; 136/248; 126/424; 126/438; 126/443
[58] Field of Search ........ 136/89 PC, 89 HY, 83 CA; 126/424, 438, 443

[56] References Cited

U.S. PATENT DOCUMENTS

| | | | |
|---|---|---|---|
| 3,866,285 | 2/1975 | Clark | 29/157 R |
| 3,991,741 | 11/1976 | Northrup, Jr. | 126/425 |
| 4,027,653 | 6/1977 | Meckler | 126/438 X |
| 4,136,673 | 1/1979 | Escher | 126/4 |
| 4,210,463 | 7/1980 | Escher | 136/89 PC |

OTHER PUBLICATIONS

D. G. Scheuler et al., "Integration of Photovoltaic & Solar Thermal Energy Conversion Systems", *Conf. Record, 11th IEEE Photovoltaic Specialists Conf.* (1975), pp. 327-331.

M. A. Dugnay, "Solar Electricity: The Hybrid System Approach", *American Scientist*, vol. 65, pp. 422-427 (1977).

*Primary Examiner*—Aaron Weisstuch
*Attorney, Agent, or Firm*—John C. Purdue

[57] ABSTRACT

A solar energy collector is disclosed. The collector includes a photo-voltaic cell, a reflector for directing solar energy from the sun to the photo-voltaic cell, a mount for the reflector, vacuum means and positioning means for the reflector. The vacuum means separates the photo-voltaic cell and the reflector from the atmosphere to prevent conduction and convection heat losses therefrom and corrosion of the reflector. The mounting means supports the reflector within the vacuum means for rotation about an axis along which the photo-voltaic cell extends. The positioning means is operable to produce a magnetic field which attracts a ferromagnetic portion of the reflector and to rotate the magnetic field about the axis to cause rotation of the reflector and maximizing the amount of solar energy directed to the photo-voltaic cell.

4 Claims, 4 Drawing Figures

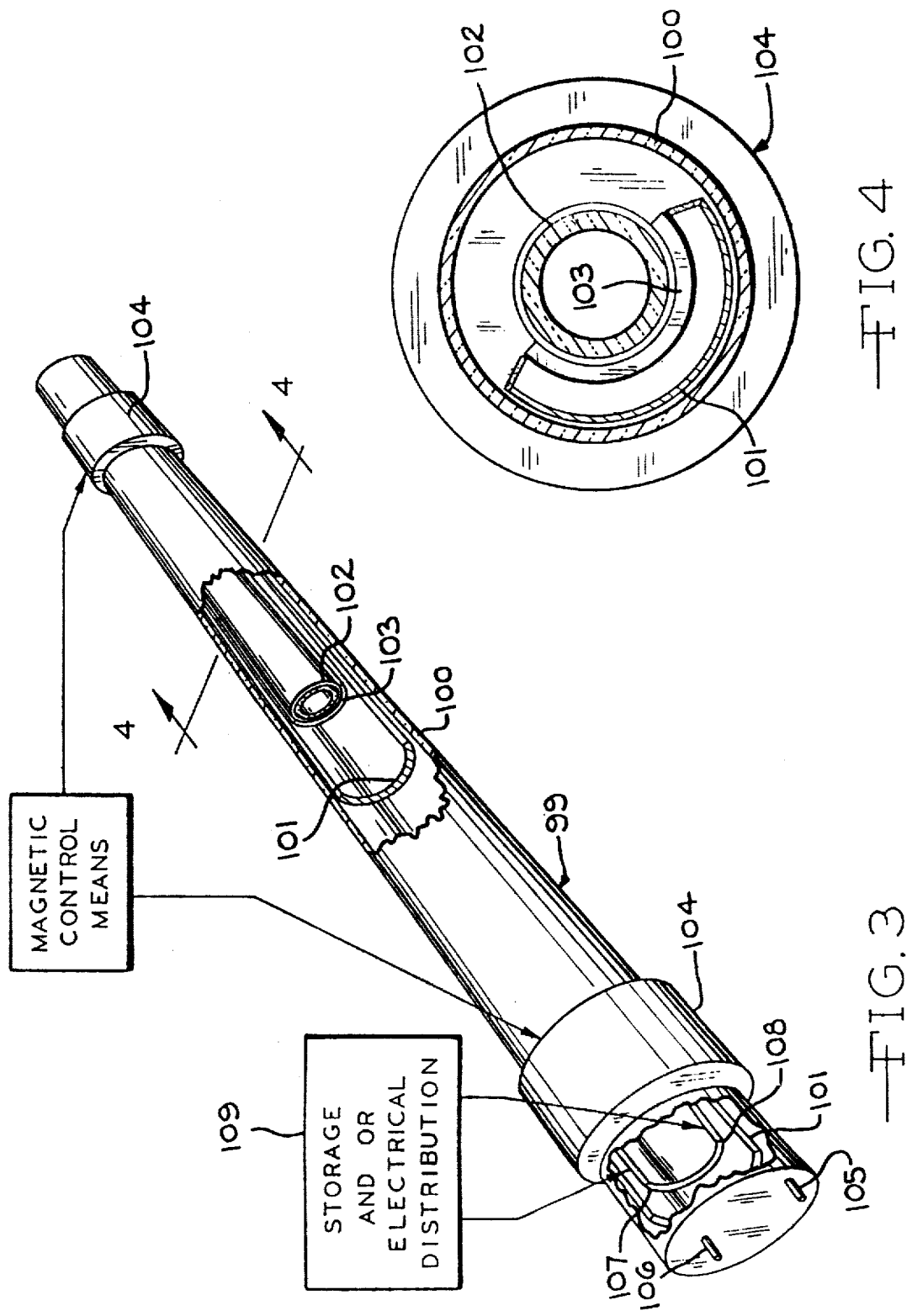

SOLAR ENERGY COLLECTOR

CROSS REFERENCE TO RELATED APPLICATION

This is a division of application Ser. No. 886,389, filed Mar. 14, 1978, now abandoned.

BACKGROUND OF THE INVENTION

The use of solar energy in the operation of air conditioning apparatus is disclosed, for example, in U.S. Pat. No. 4,011,731, granted Mar. 15, 1977. The use of an internal combustion engine as a source for both shaft work, to drive, for example, the compressor of air conditioning apparatus and heat to be used, for example, to regenerate the desiccant of air conditioning apparatus, has also been suggested, for example in U.S. Pat. No. 3,401,530, granted Sept. 17, 1978.

THE PRESENT INVENTION

To a limited extent, the present invention combines features of the apparatus suggested by the two patents identified above in a particular manner with other elements of apparatus not suggested by said patents to produce new apparatus which combines advantageous features of the previously known apparatus with previously unachieved advantages while, simultaneously, eliminating deficiencies of the previously known apparatus. In essence, the apparatus of the instant invention uses an electrical generator driven by an internal combustion engine, or a subsequently discussed equivalent, as a source for both electrical energy and heat energy whenever the heat available from solar energy is inadequate to meet the thermal requirements of the air conditioning apparatus; the electrical energy generated on the site, in turn, is used to replace a part of the electrical energy required to operate the apparatus and which, when the extra heat energy is not required, is merely purchased from a utility. As a consequence, the present apparatus utilizes electrical energy generated by a utility, where possible in a hydroelectric or nuclear power plant requiring no fossil fuel or in a coal fired steam generating plant using the most abundant, and in ample domestic supply, fossil fuel whenever the heat required by the refrigerating apparatus is available from solar collectors. However, when the heat available from solar collectors is inadequate, the supply thereof is supplemented by, for example, an internal combustion engine used to drive an electrical generator. As a consequence, the electrical energy required from the utility is actually decreased both in peak demand and in total quantity, in apparatus according to the present invention, when the prevailing conditions are such that, in ordinary apparatus, that requirement would be increased.

BRIEF DESCRIPTION OF THE DRAWINGS

FIG. 3 is a perspective view, with parts broken away to show details of construction, of a combined solar collector-solar cell which can be used in place of the solar collector shown in FIG. 1.

FIG. 4 is a sectional view taken along the plane 4—4 of the collector-cell of FIG. 3.

DESCRIPTION OF THE PREFERRED EMBODIMENTS

Figure 1:
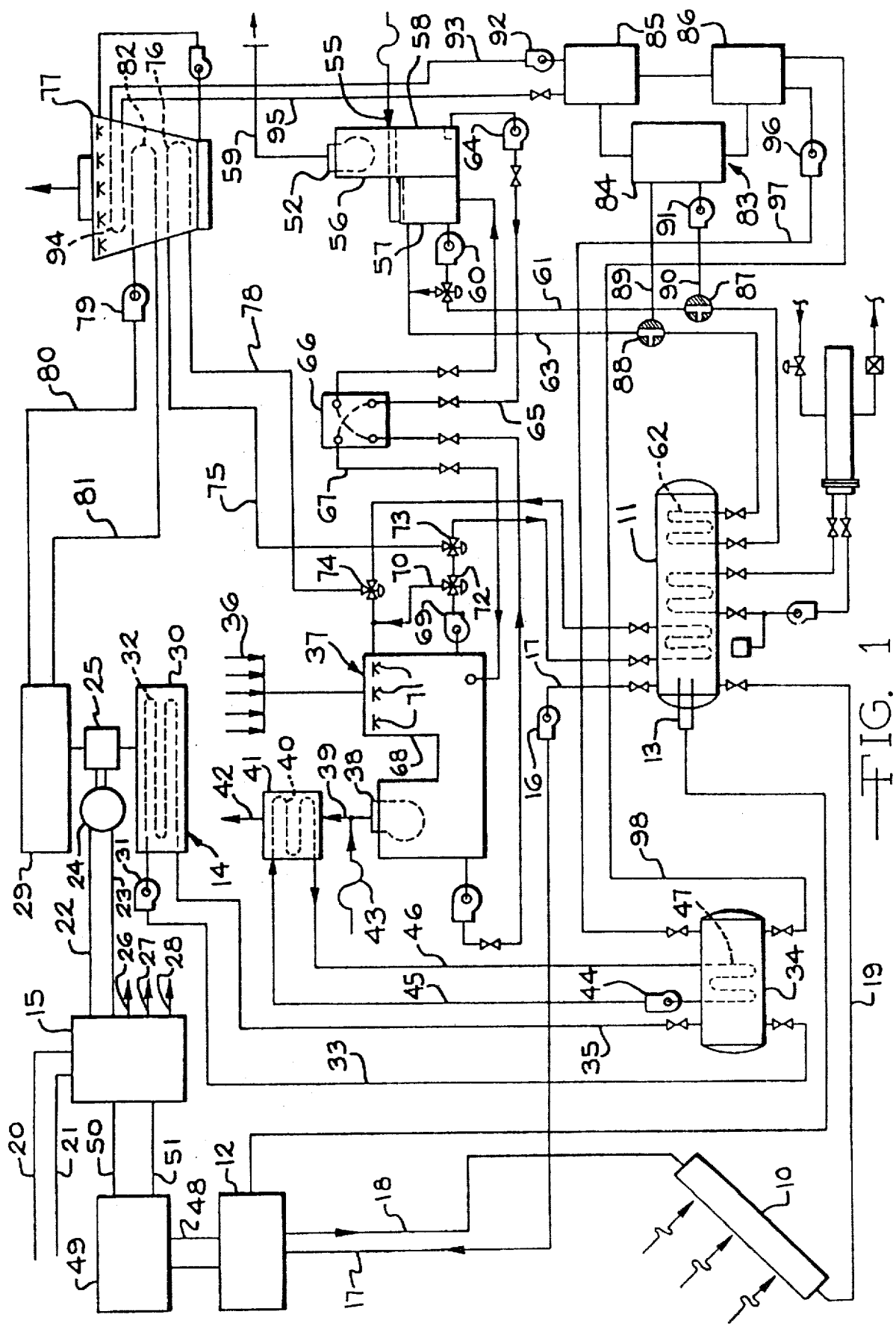
FIG. 1 is a partially schematic view showing apparatus according to the instant invention which includes an internal combustion engine operatively connected to drive an electrical generator, and operated whenever heat from solar collectors is inadequate to supply the thermal requirements of the apparatus.

The apparatus according to the invention shown in FIG. 1 of the drawings includes a solar collector 10, a heated fluid storage tank 11, an internal combustion engine 12, a sensor-controller 13 responsive to the temperature of fluid in the heated fluid storage tank 11, air conditioning apparatus indicated generally at 14 and a sequencing switch 15. The apparatus also includes a pump 16 for circulating a heat transfer fluid from the storage tank 11 through a line 17 to the internal combustion engine 12 and from thence through a line 18, the solar collector 10 and a line 19 back to the storage tank 11. When the internal combustion engine 12 is in operation the heat transfer fluid circulated thereto is heated by circulation through the liquid cooling system thereof, by contact with exhaust gases, or both. Similarly, when solar energy is incident upon the collector 10, heat transfer fluid circulated therethrough is heated. Under many conditions of operation the solar collector 10 supplies all the heat required, as subsequently described, for operation of the FIG. 1 apparatus. When this is the situation, the sensor-controller 13 inactivates the internal combustion engine 12, so that all of the heat energy stored in the tank 11 enters the system through the collector 10. However, whenever the sensor-controller 13 detects a temperature below a predetermined limit, it is operable to start the engine 12, and to control the operation thereof so that the temperature of the heat transfer fluid within the storage tank 11 fluctuates between predetermined upper and lower limits.

Whenever the engine 12 is not in operation, the sequencing switch 15 receives energy from utility lines (not illustrated), which energy flows through building distributor lines 20 and 21. The sequencing switch 15, in this mode of operation, furnishes electrical energy through lines 22 and 23 to an electric motor 24 which, in turn, drives a compressor 25 of the air conditioning apparatus 14. Similarly, in this mode of operation, the sequencing switch 15 furnishes electrical energy received through the lines 20 and 21 through circuits schematically indicated at 26, 27 and 28 to drive pumps and blowers of the air conditioning apparatus 14, as subsequently explained in more detail.

The air conditioning apparatus 14 also includes a condenser 29 and an evaporator 30. A pump 31 causes water to flow from an indirect heat exchange coil 32 inside the evaporator 30 through a line 33 to a cold water storage tank 34 and, through a line 35, back to the indirect heat exchanger 32.

Air to be conditioned in the apparatus of FIG. 1 flows, as indicated by arrows 36, into a dehumidifier 37 from which it is exhausted by a fan 38 into a duct 39 from which it flows in thermal contact with an indirect heat exchanger 40 within an enclosure 41 and, from thence, as indicated by an arrow 42, to a zone of a building to be conditioned, or to risers, ducts and the like (not illustrated) for distribution through the building. In the specific apparatus shown in FIG. 1 return air from the space being conditioned is mixed in the duct 39 with air leaving the dehumidifier 37, flowing into the duct 39 through a duct 43. The indirect heat exchange coil 40 receives chilled water circulated by a pump 44 through a line 45 to the coil 40, and return from the coil 40 through a line 46 to an indirect heat exchange coil 47 within the chilled water storage tank 34. The pump 44 can conveniently be controlled by a sensor-controller (not illustrated) to maintain a constant dry bulb temperature for the air leaving the enclosure 41 through duct 42.

Figure 2:
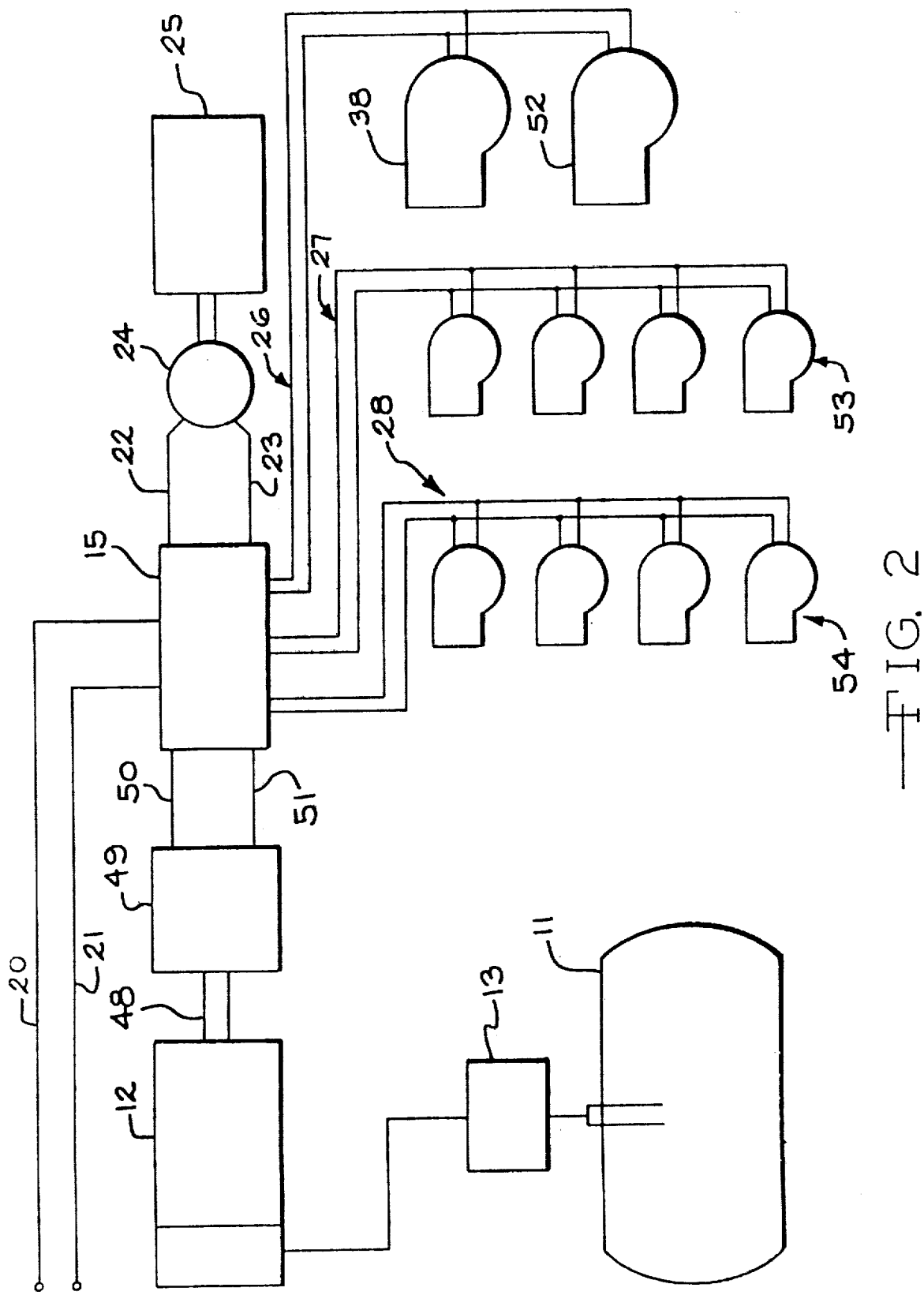
FIG. 2 is a partially schematic view showing the operation of a sequencing switch which is a part of the apparatus of FIG. 1, and the manner in which that switch is used to distribute the electrical energy generated when heat from solar collectors is inadequate and the internal combustion engine of FIG. 1 is operated.

As previously stated, whenever the sensor-controller 13 detects a temperature in the heated fluid storage tank 11 below a control point, the internal combustion engine 12 is caused to operate. The engine 12 is operatively connected through a drive shaft 48 to a generator 49; as a consequence, when the engine 12 is started, the generator 49 is driven, and electrical energy flows through lines 50 and 51 to the sequencing switch 15. Referring to FIG. 2, depending upon the amount of electrical energy available from the generator 49, and delivered to the sequencing switch 15 through the lines 50 and 51, the switch 15 channels that electrical energy to the fan 38 and a fan 52 (subsequently described), correspondingly reducing the energy it receives from the utility through the lines 20 and 21 or it can deliver energy through lines indicated generally at 27 to a series of pumps indicated generally at 53, through lines indicated generally at 28 to a second series of pumps indicated generally at 54, through the lines 22 and 23 to the motor 24 or through two or more of the named circuits to the energy using devices in question.

Referring again to FIG. 1, the previously mentioned fan 52 is a part of the regenerating portion of the dehumidification apparatus 37, serving the function of drawing air (preferably relief air from the building being dehumidified) as indicated by an arrow 55 into a regenerator 56 through which it flows to the left and into a spray chamber 57, then laterally to the right and upwardly through an exhaust chamber 58, by the fan 52 and through a duct 59 from which it is vented from the system. Desiccant is circulated from the spray chamber 57 by a pump 60, flowing through a line 61 into a coil 62 within the heated fluid storage tank 11, and, from thence, back through a line 63 and into sprays (not illustrated) from which it is sprayed within the chamber 57 to effect regeneration. Concentrated hygroscopic liquid is circulated by a pump 64 through a line 65, an indirect heat exchanger 66 and a line 67 to the sump of a contactor 68 of the dehumidifier 37. Hygroscopic liquid is circulated from the contactor 68 by a pump 69 through a line 70, and is discharged from spray heads 71 within the contactor 68 to effect dehumidification. If required, depending upon the setting of valves 72, 73 and 74, all, or some part of the hygroscopic liquid delivered to the sprays 71 can be circulated through a line 75 to an indirect heat exchange coil 76 in an evaporative cooler 77 and, from thence, through a line 78 back to the valve 74 and to the sprays 71.

Heat can be removed from the condenser 29 of the air conditioning apparatus 14 by cooling water circulated by a pump 79 through a line 80 to an indirect heat exchanger (not illustrated) inside the condenser 29, and from thence through a line 81 back to a coil 82 in the evaporative cooler 77.

The apparatus of FIG. 1 also includes an absorption refrigerator indicated generally at 83. The refrigerator includes a boiler 84, a condenser 85 and an evaporator 86. Whenever there is excess heat available in the heated fluid storage tank 11, for whatever reason, that extra heat can be used in the refrigerator 83 by manual or automatic control of valves 87 and 88 to divert all or a part of the heated fluid in the line 63 to cause the heated fluid to flow through a line 89, an indirect heat exchange coil (not illustrated) within the boiler 84 and, through a line 90, back to the line 61. A pump 91 is provided to cause circulation as just described. Heat is removed from the condenser 85 of the apparatus 83 by a pump 92 which circulates water through a line 93, an indirect heat exchanger 94 in the evaporative cooler 77, a line 95, and an indirect heat exchanger (not illustrated) inside the condenser 85 back to the pump 92. Operation of the refrigerator 83 enables the evaporator 86 to remove heat from an indirect heat exchange coil (not illustrated) disposed therein. Such removal of heat enables the circulation of chilled water by a pump 96, through a line 97 into the cold water storage tank 34, and from thence back through a line 98 to the indirect heat exchanger within the evaporator 86. The refrigerator 83 of the apparatus of FIG. 1 enables the use of excess heat, from whatever source, to augment the stored chilled water in the storage tank 34, thereby supplementing the operation of the apparatus 14.

Referring to FIG. 3, a combined solar collector and solar cell is indicated generally at 99. The combined collector-cell 99 is made up of a glass exterior tube 100, which is evacuated, and within which are disposed a reflector 101 and a heat transfer means 102, in addition to a photovoltaic cell 103. The reflector 101 carries a ferromagnetic insert to enable magnetic control means 104 (designated by legend) to control the rotational position of the reflector 101 for maximum incidence of energy upon the tube 102 and upon the cell 103. The tube 102 has two conduits, 105 and 106, which extend to the exterior of the collector-cell 99. Through these conduits 105 and 106, circulating heat transfer fluid can collect the heat from heat transfer means 102, which cools the photovoltaic cell 103, and thereby providing heat energy to fluid in the storage tank 11. Solar energy incident upon the cell 103 causes a potential difference between the points 107 and 108, so that electric power from the cell 103 can be stored or distributed as indicated by legend 109. Alternatively, a battery of the collector cells can be substituted for the collector 10 in the apparatus of FIG. 1, and the electrical energy from the cells 103 can be collected and stored, as indicated in FIG. 3, or can be used to provide electrical energy to power a thermoelectric circuit made up, for example, of P and N elements arranged and positioned to transfer heat from conditioned air after it is discharged from the fan 52 of the FIG. 1 apparatus.

It will be appreciated that a fuel cell can be substituted for the internal combustion 12 and generator 49 as a source for heat when the temperature of the fluid in the heated fluid storage tank decreases below the control temperature, and that various other changes and modifications can be made from the details of the invention as specifically disclosed in the drawings and described in connection therewith without departing from the spirit and scope of the invention as defined in the appended claims.

What I claim is:

1. An improved solar energy collector comprising, in combination, a photovoltaic cell, reflector means for directing solar energy from the sun to said photo-voltaic cell, said reflector means having a ferromagnetic portion, vacuum insulating means effective to prevent heat losses from said cell and corrosion of said reflector, means mounting said reflector means within said vacuum insulating means for rotation about an axis along which said photo-voltaic cell generally extends, and means for automatically positioning said reflector means for directing a maximum amount of solar energy to said photo-voltaic cell as the sun advances across the sky each day, said last-named means including means for producing a magnetic field which attracts the ferromagnetic portion of said reflector and means for rotating said magnetic field about the axis for in turn rotating said reflector about the axis for reflecting a maximum amount of solar energy from the sun to said photo-voltaic cell.

2. A solar energy collector as claimed in claim 1 which additionally includes an electrical circuit exterior of said vacuum insulating means operably connected so that an EMF generated by said photo-voltaic cell causes an EMF across said circuit.

3. A solar energy collector as claimed in claim 1 which additionally includes means for transferring heat from said photo-voltaic cell.

4. A solar energy collector as claimed in claim 3 wherein said heat transfer means includes a fluid conduit and a solar energy collector including means for circulating a heat transfer fluid from the exterior of the collector through said conduit and back to the exterior of the collector.

* * * * *